United States Patent
Bandiera (10) Patent No.: US 9,989,599 B2
(45) Date of Patent: Jun. 5, 2018

(54) MAGNETIC SENSOR CELL FOR MEASURING THREE-DIMENSIONAL MAGNETIC FIELDS

(71) Applicant: Crocus Technology SA, Grenoble (FR)

(72) Inventor: Sebastien Bandiera, Corenc (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 131 days.

(21) Appl. No.: 15/028,114

(22) PCT Filed: Oct. 1, 2014

(86) PCT No.: PCT/EP2014/071108
§ 371 (c)(1),
(2) Date: Apr. 8, 2016

(87) PCT Pub. No.: WO2015/052063
PCT Pub. Date: Apr. 16, 2015

(65) Prior Publication Data
US 2016/0238676 A1    Aug. 18, 2016

(30) Foreign Application Priority Data
Oct. 11, 2013 (EP) ..................................... 13290244

(51) Int. Cl.
*G01R 33/09* (2006.01)

(52) U.S. Cl.
CPC .................................. *G01R 33/098* (2013.01)

(58) Field of Classification Search
CPC ..................................................... G01R 33/093
USPC .......................... 365/158; 324/249, 260, 252
See application file for complete search history.

(56) References Cited

U.S. PATENT DOCUMENTS

| | | | | |
|---|---|---|---|---|
| 6,317,359 B1 * | 11/2001 | Black | ...................... | G11C 11/16 365/158 |
| 6,653,704 B1 * | 11/2003 | Gurney | ................. | H01L 27/224 257/108 |
| 2005/0088875 A1 * | 4/2005 | Abraham | ................ | G11C 11/16 365/158 |
| 2007/0297222 A1 * | 12/2007 | Leuschner | .............. | G11C 11/15 365/171 |

(Continued)

OTHER PUBLICATIONS

International Search Report for PCT/EP2014/071108 dated Dec. 2, 2014.
Written Opinion for PCT/EP2014/071108 dated Dec. 2, 2014.

*Primary Examiner* — Hoai V Ho
*Assistant Examiner* — Jay Radke
(74) *Attorney, Agent, or Firm* — Pearne & Gordon LLP (57) ABSTRACT

A magnetic sensor cell includes a magnetic tunnel junction including a reference layer having a reference magnetization oriented parallel to the plane of the reference layer, a sense layer having a sense magnetization, and a tunnel barrier layer between the sense and reference layers. A magnetic device is configured for providing a sense magnetic field for aligning the sense magnetization. The sense layer magnetization is orientable between a direction parallel to the plane of the sense layer and a direction perpendicular to the plane of the sense layer when the sense magnetic field is provided. The magnetic sensor cell can be used for sensing an external magnetic field including a component oriented parallel to the plane of the sense layer and a component oriented perpendicular to the plane of the sense layer.

16 Claims, 8 Drawing Sheets

(56) References Cited

U.S. PATENT DOCUMENTS

2010/0140726 A1    6/2010   Apalkov et al.
2011/0007560 A1    1/2011   Dieny et al.
2013/0241536 A1    9/2013   Cambou et al.

* cited by examiner

MAGNETIC SENSOR CELL FOR MEASURING THREE-DIMENSIONAL MAGNETIC FIELDS

FIELD

The present disclosure concerns a magnetic sensor cell having a magnetic tunnel junction that can sense a magnetic field component perpendicular to the plane of the magnetic tunnel junction and a magnetic field component parallel to the plane of the magnetic tunnel junction. The disclosure further concerns a method for sensing the magnetic field components perpendicular and parallel to the plane of the tunnel junction.

DESCRIPTION OF RELATED ART

Figure 1:
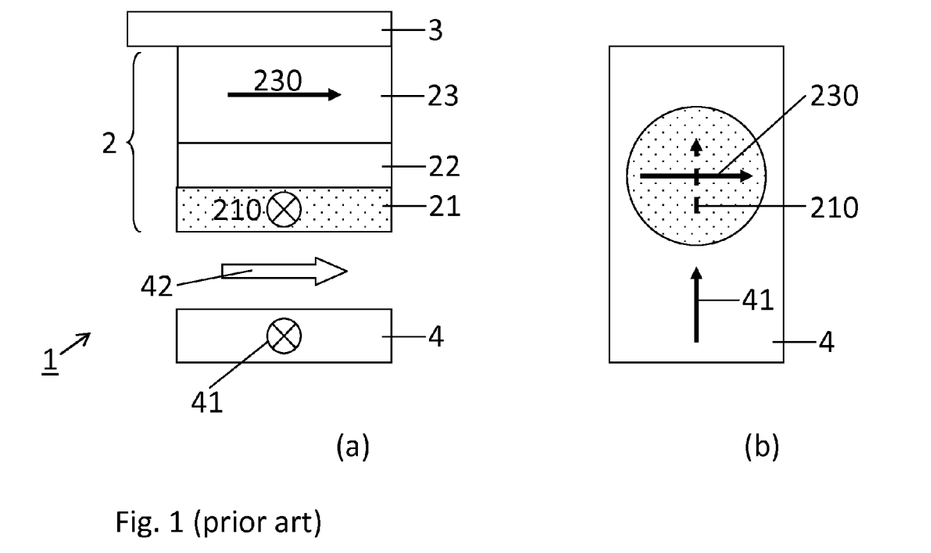
FIG. 1 represents a cross section view (a) and a top view (b) of a conventional magnetic sensor cell comprising a magnetic tunnel junction with a sense layer having a sense magnetization.

Self-referenced magnetic tunnel junctions can be used to sense magnetic fields, in magnetic sensors or compasses. FIG. 1 represents a cross section view (FIG. 1a) and a top view (FIG. 1b) of a magnetic sensor cell 1 according to an embodiment. The magnetic sensor cell 1 comprises a magnetic tunnel junction 2 including a reference layer 23 having a reference magnetization 230, a sense layer 21 having a sense magnetization 210 and a tunnel barrier layer 22 between the sense layer 21 and the reference layer 23. A current line 3 is in electrical contact with one extremity of the magnetic tunnel junction 2. The magnetic sensor cell 1 further comprises a field line 4 adapted for passing a field current 41 such as to generate a sense magnetic field 42. The reference magnetization 230 and the sense magnetization 210 are oriented parallel to the plane of the reference and sense layers 21, 23.

During a read operation, the read magnetic field 42 is used for aligning the sense magnetization parallel or antiparallel to the reference magnetization.

Ideally, the sense layer 21 should have a linear and non-hysteretic behavior with respect to the applied field 42, when measured along the pinned reference layer direction. The linear sensing is usually achieved by having the sense magnetization 210 being perpendicular to the reference magnetization 230. This can be achieved by pinning the reference magnetization 230 perpendicular to the anisotropy axis of the sense layer 21. The anisotropy axis of the sense layer 21 lies parallel to the plane of the sense and reference layers 21, 23.

Self-referenced magnetic tunnel junctions thus allow for measuring the magnetic field in two directions parallel to the plane of the sense and reference layers. Any component of the magnetic field perpendicular to the plane of the sense layer cannot be detected.

US2010140726 discloses a method and system for providing a magnetic element are described. The magnetic element includes pinned and free layers, a nonmagnetic spacer layer between the free and pinned layers, and a stability structure. The free layer is between the spacer layer and the stability structure. The free layer has a free layer magnetization, at least one free layer easy axis, and at least one hard axis. The stability structure includes magnetic layers and is configured to decrease a first magnetic energy corresponding to the free layer magnetization being aligned with the at least one easy axis without decreasing a second magnetic energy corresponding to the free layer magnetization being aligned with the at least one hard axis. The magnetic element is configured to allow the free layer magnetization to be switched to between states when a write current is passed through the magnetic element.

US2011007560 discloses a magnetic device including a magnetic reference layer with a fixed magnetization direction located either in the plane of the layer or perpendicular to the plane of the layer, a magnetic storage layer with a variable magnetization direction, a non-magnetic spacer separating the reference layer and the storage layer and a magnetic spin polarizing layer with a magnetization perpendicular to that of the reference layer, and located out of the plane of the spin polarizing layer if the magnetization of the reference layer is directed in the plane of the reference layer or in the plane of the spin polarizing layer if the magnetization of the reference layer is directed perpendicular to the plane of the reference layer.

SUMMARY

The present disclosure concerns a magnetic sensor cell comprising a magnetic tunnel junction including a reference layer having a reference magnetization oriented substantially parallel to the plane of the reference layer, a sense layer having a sense magnetization, and a tunnel barrier layer between the sense and reference layers; and a field line adapted for passing a field current such as to generate a sense magnetic field adapted for aligning the sense magnetization; wherein the sense layer magnetization is orientable between a direction parallel to the plane of the sense layer and a direction perpendicular to the plane of the sense layer when the sense magnetic field is generated.

In an embodiment, the sense layer magnetization is orientable with a magnitude of an external magnetic field being below 150 Oe.

In another embodiment, the sense magnetization has an initial orientation, in the absence of an external magnetic field, substantially perpendicular to the plane of the sense layer and an aligned orientation, in the presence of the sense magnetic field, being at least partly oriented parallel to the plane of the sense layer.

In yet another embodiment, the sense magnetization has an initial orientation, in the absence of the sense magnetic field, substantially parallel to the plane of the sense layer and an aligned orientation, in the presence of the sense magnetic field, being at least partly oriented perpendicular to the plane of the sense layer.

An advantage of the magnetic sensor cell is that the sense magnetization is always aligned perpendicular to the reference magnetization in the absence of magnetic field.

Another advantage of the magnetic sensor cell is that it allows measuring all component of space of an external magnetic field.

BRIEF DESCRIPTION OF THE DRAWINGS

The disclosure will be better understood with the aid of the description of an embodiment given by way of example and illustrated by the figures, in which.

DETAILED DESCRIPTION OF POSSIBLE EMBODIMENTS

Figure 2:
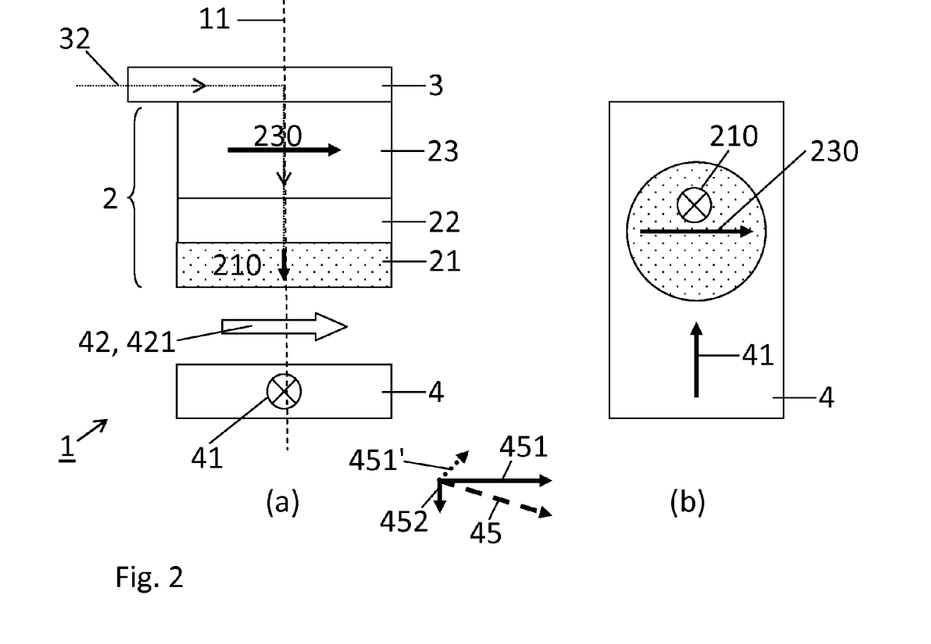
FIG. 2 represents a cross section view (a) and a top view (b) of a magnetic sensor cell comprising a magnetic tunnel junction with a sense layer having a sense magnetization, according to an embodiment.

FIG. 2 represents a cross section view (FIG. 2a) and a top view (FIG. 2b) of a magnetic sensor cell 1 according to an embodiment. The magnetic sensor cell 1 comprises a magnetic tunnel junction 2 including a reference layer 23 having a reference magnetization 230 oriented substantially parallel to the plane of the reference layer 23, a sense layer 21 having a sense magnetization 210 and a tunnel barrier layer 22 between the sense layer 21 and the reference layer 23. The magnetic sensor cell 1 further comprises a field line 4 adapted for passing a field current 41 in a direction parallel to the plane of the sense layer 21. A sense magnetic field 42 is generated by passing the field current 41 in the field line 4 with a direction being determined by the polarity of the field current 41. In the example of FIG. 2, the field current 41 is shown entering the page such that the sense magnetic field 42 has a parallel component 421 parallel to the plane of the sense layer 21 and directed towards the right.

In an embodiment, the sense layer magnetization 210 is orientable between a direction parallel to the plane of the sense layer 21 (in-plane) and a direction perpendicular to the plane of the sense layer 21 (out-of-plane) when the sense magnetic field 42 is generated, or in the presence of the external magnetic field 45 or of any other external magnetic field.

The sense layer 21 can have a higher susceptibility when an external magnetic field is applied perpendicularly to the plane of the sense layer 21 than when it is applied parallel to the plane of the sense layer 21. Here, the external magnetic field can be any magnetic field applied to the magnetic tunnel junction 2 also including the sense magnetic field 42. Preferably, the susceptibility of the sense layer 21 is such that the sense magnetization 210 can be oriented from a direction out-of-plane to a direction in-plane by using the external magnetic field 42 having a magnitude that is lower than 150 Oe while providing a tunnel magnetoresistance (TMR) of the magnetic tunnel junction 2 being higher than 30%.

In an embodiment, in the absence of magnetic field the sense magnetization 210 is initially oriented substantially perpendicular to the plane of the sense layer 21 (see FIG. 2).

Figure 3:
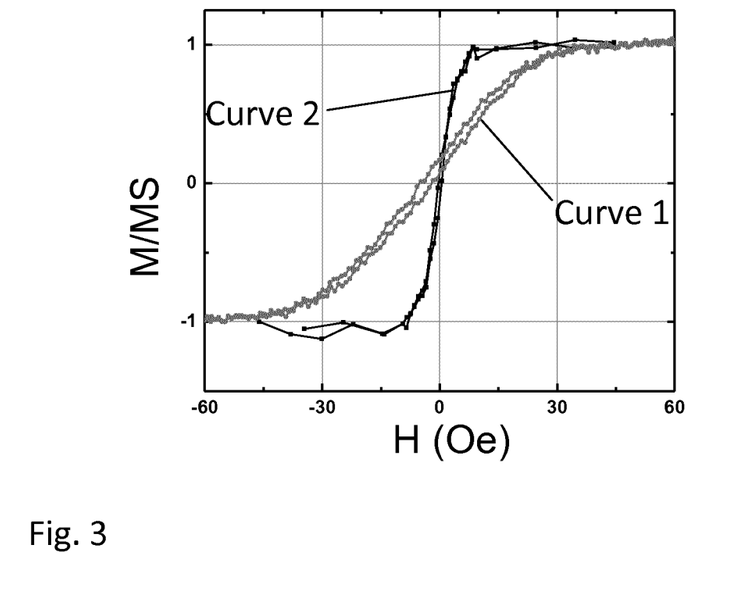
FIG. 3 reports a magnetic hysteresis loops measured for the sense layer of FIG. 2, according to an embodiment.

FIG. 3 reports a magnetic hysteresis loops measured for the sense layer 21 of FIG. 2 when the magnetic field (noted as H in FIG. 3) is applied in a direction perpendicular to the plane of the sense layer 21 (curve 2) and when the external magnetic field H is applied in a direction parallel to the plane of the sense layer 21 (curve 1). The steeper slope in the first case (curve 2) reflects the out-of-plane magnetization of the sense layer 21.

Figure 11:
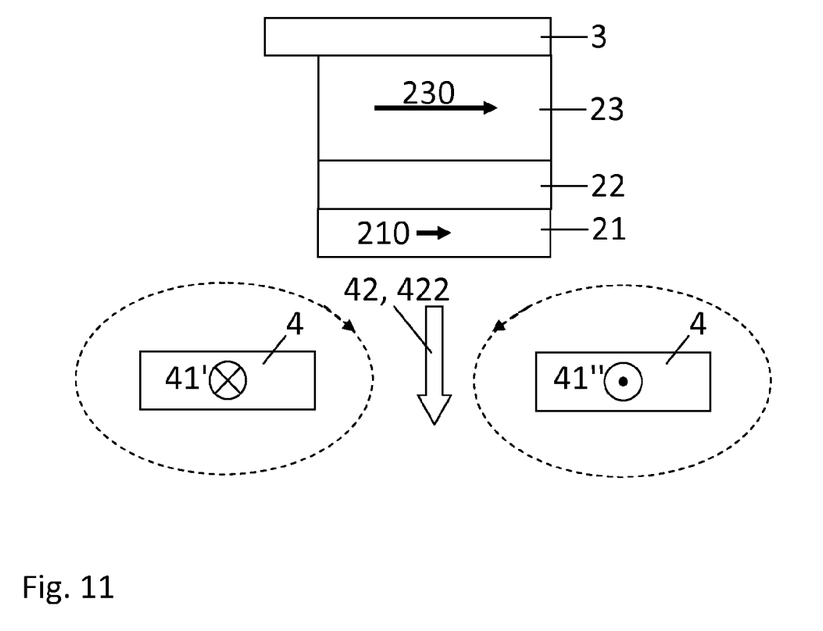
FIG. 11 shows the magnetic sensor cell of FIG. 10, according to another embodiment.

In another embodiment shown in FIG. 11, in the absence of an external magnetic field the sense magnetization 210 is initially oriented substantially parallel to the plane of the sense layer 21. The sense layer 21 can have a perpendicular anisotropy such that the sense magnetization 210 can be oriented out-of-plane when the sense magnetic field 42 is applied perpendicularly to the plane of the sense layer 21 with a field lower than $4\pi M_S$, where $M_S$ denotes the saturation magnetization of the sense layer 21. In FIG. 11, the sense magnetic field 42 has a perpendicular component 422 perpendicular to the plane of the sense layer 21.

Figure 4:
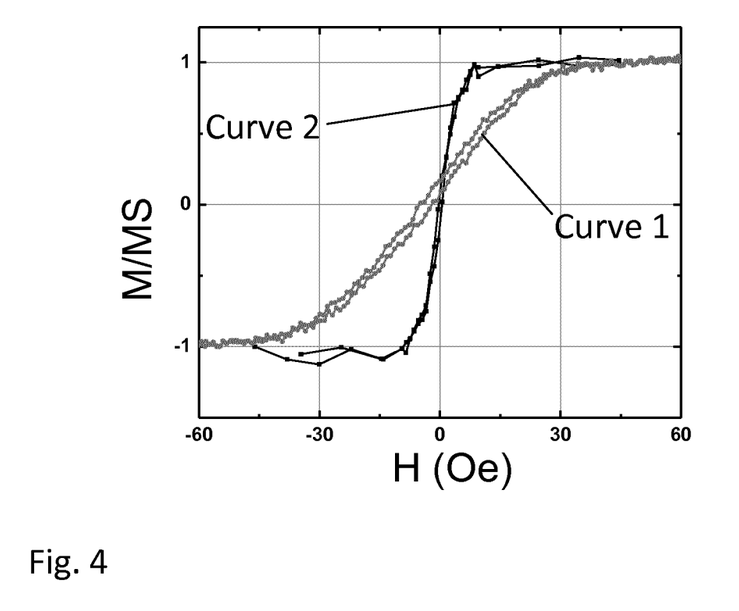
FIG. 4 reports a magnetic hysteresis loops measured for the sense layer of FIG. 2, according to another embodiment.

FIG. 4 reports a magnetic hysteresis loops measured for the sense layer 21 when an external magnetic field H is applied in a direction perpendicular to the plane of the sense layer 21 (curve 1) and when the external magnetic field (noted as H in FIG. 4) is applied in a direction parallel to the plane of the sense layer 21 (curve 2). The saturation field of about 30 Oe for curve 1 shows that the sense magnetization 210 presents a perpendicular anisotropy component that reduces the saturation field to a value below $4\pi M_S$, where $4\pi M_S$ is the saturation field of the sense magnetization 210 that does not have any perpendicular anisotropy component.

The sense layer 21 can comprises a material including any one of or a combination of Fe, Co, Ni, Tb, Pt, Pd, Al, Dy, Ga, Mn, Ho, Nd or Sm, FePt, FePd, CoPt, CoPd, GdFeCo, TbFeCo, GaMn, GeMn or AlMn. In this configuration, the sense layer 21 comprising the material can have a thickness comprised between 0.2 nm and 50 nm.

Figure 17:
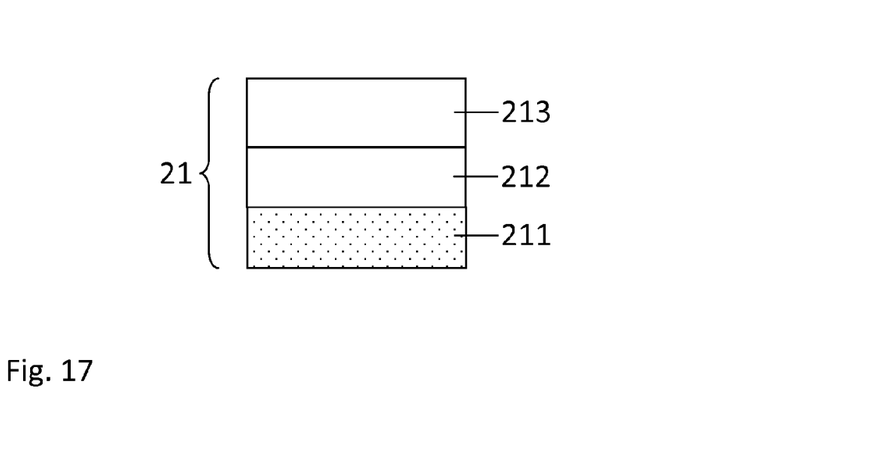
FIG. 17 shows the sense layer according, to an embodiment.

As shown in FIG. 17, the sense layer 21 can comprise a ferromagnetic layer 211 and a non-magnetic layer 212. The sense ferromagnetic layer 211 can include any one of Co, Fe or Ni or an alloy comprising any one or a combination of these elements. The sense ferromagnetic layer 211 can have a thickness that is comprised between 0.2 nm and 5 nm. The non-magnetic layer 212 can comprise any one of Pt, Pd, Ta, Hf, Nb, Cr, V, Cu, Au, Ti, Ag, Ru, W or an alloy comprising any one or a combination of these elements. Alternatively, non-magnetic layer 212 can be made of any oxide or oxi-nitride such as MgO or AlOx.

In an embodiment, the tunnel barrier 22 comprises an oxide having an oxidation state being adjusted such that the sense layer 21 has a perpendicular anisotropy.

The magnetic sensor cell 1 can be programmed by switching the reference magnetization 230 in a predetermined direction in the plane of the reference layer 23 (see FIG. 2). The programming operation can be thermally assisted wherein the programming operation further comprises a step of heating the magnetic tunnel junction 2 to a high temperature threshold. To that end, the magnetic tunnel junction 2 can comprises an antiferromagnetic layer (not shown) pinning the reference magnetization at a low temperature threshold and freeing it at the high temperature threshold. Heating the magnetic tunnel junction 2 at the the high temperature threshold can be performed by passing a heating current 32 in the magnetic tunnel junction 2 via a current line 3. After switching the reference magnetization 230, the magnetic tunnel junction 2 can be cooled to the low temperature threshold such as to pin the reference magnetization 230 in the switched state.

According to an embodiment, a method for sensing an external magnetic field 45 comprising an in-plane component 451 oriented parallel to the plane of the sense layer 21 and an out-of-plane component perpendicular to the plane of the sense layer 21 using the magnetic sensor cell 1 comprises the steps of sensing the in-plane component 451; and sensing the out-of-plane component 452.

Sensing the in-plane component 451 can be performed using a conventional differential read operation. For example, the sensing operation can comprise passing the field current 41 having an alternating polarity into the field line 4 such as to alternate the sense magnetization 210 between a direction substantially parallel and antiparallel to the reference layer magnetization 230. The alternating field current 41 can be such that the orientation of the sense magnetization 210 is alternated without being switched completely in the parallel or antiparallel direction. The in-plane component 451 is then sensed by measuring the resistance R (or voltage) of the magnetic tunnel junction 2 as a function of the field current 41. Such sensing operation is described in more details in patent application US2013241536 by the present applicant.

Sensing the out-of-plane component 452 depends on the initial orientation of the sense magnetization 210. In an embodiment wherein the sense magnetization 210 is initially oriented out-of-plane in the absence of the sense magnetic field 42 and external field 45, sensing the out-of-plane component 452 comprises passing the field current 41 in the field line 4 such that to align the sense magnetization 210 from its initial direction to an aligned direction being at least partly oriented parallel to the plane of the sense layer 21 (i.e., parallel or antiparallel to the reference magnetization 230). In the example of FIG. 2, the field current 41 enters the page such that the magnetic field 42 is directed towards the right hand side of the page such that the sense magnetization will be aligned by the magnetic field 42 in the same direction as the reference magnetization 230.

The value of the field current 41 required for saturating the sense magnetization 210 is proportional to the norm of the out-of-plane component 452. Consequently, the values of the field current 41 required for saturating the sense magnetization 210 in the directions parallel and antiparallel to the reference magnetization 230 can be used for determining the norm of the out-of-plane component 452. In that case, it is required to fully saturate the sense layer magnetization 210 parallel and/or antiparallel to the reference magnetization 230. Alternatively, sensing the out-of-plane component 452 can comprise measuring a resistance R of the magnetic tunnel junction 2 and determining a slope of the measured resistance R as a function of the read field current 41; and determining the magnitude of the out-of-plane component 452 using the determined slope. In that latter variant, the sense magnetization 210 can be aligned partly oriented parallel or antiparallel to the reference magnetization 230.

Figures 6, 7:
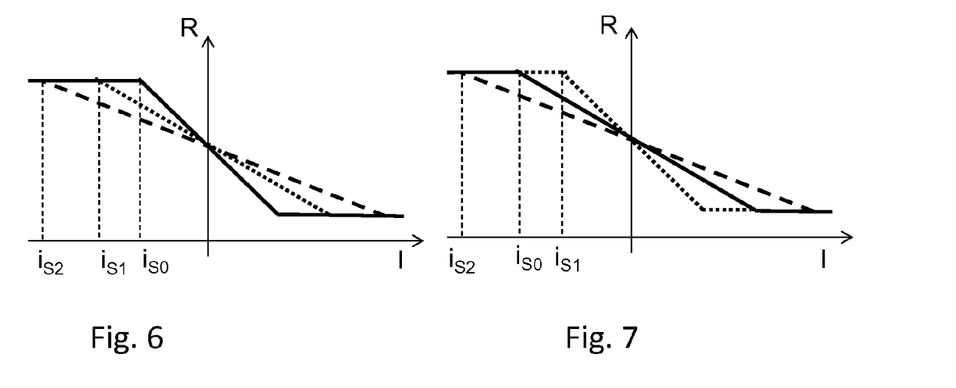
FIG. 6 shows the variation of the resistance of the magnetic tunnel junction of FIG. 2 as a function of a field current for three different perpendicular to the sense layer plane magnetic field components, according to an embodiment.
FIG. 7 shows the variation in the of the resistance of the magnetic tunnel junction of FIG. 5 as a function of a field current for three different perpendicular to the sense layer plane magnetic field components, according to another embodiment.

FIG. 6 shows the variation of the resistance R of the magnetic tunnel junction 2 as a function of the field current 41 for three different magnitude of the out-of-plane component 452 (corresponding to three different sense magnetizations 210 oriented out-of-plane). In particular, the dashed line corresponds to the case of the largest out-of-plane component 452 having the highest field current 41 required for saturating the sense magnetization 210 (or saturating current $i_{S2}$). The dotted line corresponds to the magnetic tunnel junction 2 sensing a smaller out-of-plane component 452 and has a lower saturating current $i_{S1}$. The plain line corresponds to the magnetic tunnel where the out-of-plane component 452 is null and has the lowest saturating current $i_{S0}$. However, the value of the field current 41 does not allow determining the direction of the out-of-plane component 452.

Figure 5:
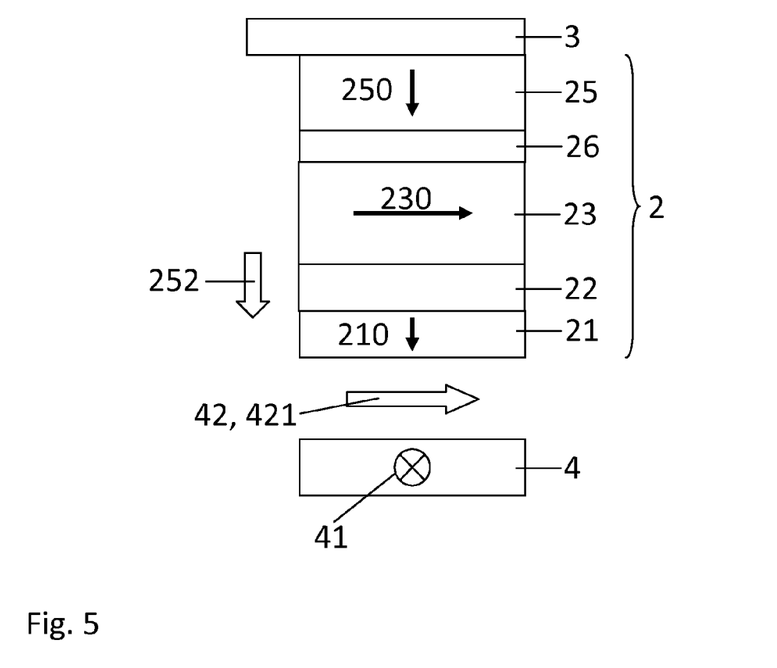
FIG. 5 represents a cross section view of the magnetic sensor cell, according to another embodiment.

In another embodiment shown in FIG. 5, the magnetic tunnel junction 2 further comprises a bias layer 25 having a bias magnetization 250 oriented out-of-plane, i.e., perpendicular to the plane of the bias layer 25 (and thus to the plane of the sense layer 21). The bias layer 25 generates a bias magnetic field 252 on the sense layer 21, also oriented perpendicular to the sense layer 21 plane.

The bias layer 25 can comprise any one of or a combination of Fe, Co, Ni, Tb, Pt, Pd, Al, Dy, Ga, Mn, Ho, Nd or Sm, FePt, FePd, CoPt, CoPd, GdFeCo, TbFeCo, GaMn, GeMn or AlMn. Alternatively, the bias layer 25 can comprise the ferromagnetic layer 211 and the non-magnetic layer 212 as described above. The bias layer 25 can further comprise an insulating layer 213. The bias layer 25 should have an anisotropy as large as possible and have an hysteresis loop that present a significant remnant magnetization in the out-of-plane direction.

The bias magnetization 250 can be oriented out-of-plane during the fabrication of the magnetic tunnel junction 2, for example, by applying a magnetic field perpendicularly to the bias layer 25 when depositing the bias layer 25, or during the annealing of the stack, or after annealing the stack. The bias layer 25 can be further pinned by an antiferromagnetic layer 26. In that case, the perpendicular magnetic field is applied when the magnetic tunnel junction is heated at a temperature lying above the blocking temperature of the antiferromagnetic layer 26.

In the case where the bias magnetic field 252 is parallel to the out-of-plane component 452, the value of the field current 41 required for saturating the sense magnetization 210 in the aligned orientation (or saturation current $i_S$) is increased compared to the case where the bias magnetic field 252 is null. Conversely, when the bias magnetic field 252 is antiparallel to the out-of-plane component 452, the value of the saturation current $i_S$ is decreased compared to the case where the bias magnetic field 252 is null.

FIG. 7 shows the variation of the resistance R of the magnetic tunnel junction 2 as a function of the field current 41 for three different perpendicular components 452 for the magnetic tunnel junction 2 of FIG. 5. The dashed line with the highest saturating current $i_{S2}$ corresponds to the case where the perpendicular component 452 is parallel to the bias magnetic field 252. The dotted line with the lowest saturating current $i_{S1}$ corresponds to the case where the perpendicular component 452 is antiparallel to the bias magnetic field 252. The plain line corresponding to the perpendicular component 452 being null exhibits an intermediate value of the saturating current $i_{S0}$.

Figure 8:
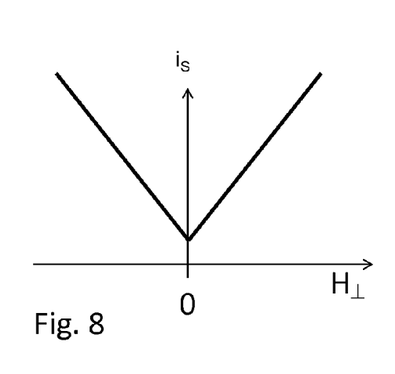
FIG. 8 represents the relation between the absolute value of a saturation current as a function of the perpendicular to the sense layer plane magnetic field components, according to an embodiment.
Figure 9:
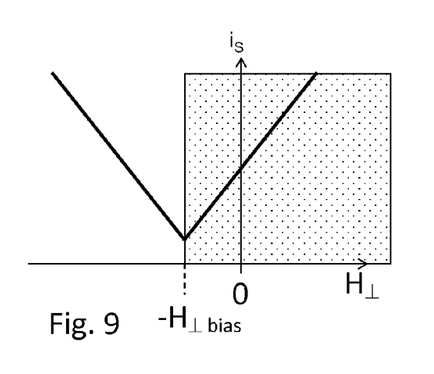
FIG. 9 represents the relation between the absolute value of a saturation current as a function of the perpendicular component of an external field, according to another embodiment.

FIGS. 8 and 9 show the relation between the absolute value of the saturation current $i_S$ as a function of the out-of-plane component 452 (represented by the symbol $H_\perp$ in FIGS. 8 and 9) in the absence of the bias layer 25 (FIG. 8) and in the presence of the bias magnetic field 252 (FIG. 9).

In FIG. 8, the minimum value of the saturation current $i_S$ corresponds to the out-of-plane component 452 being null ($H_\perp=0$) and the absolute value of the saturation current $i_s$ does not allow determining the direction of the out-of-plane component 452. In FIG. 9, the minimum value of the saturation current $i_S$ is shifted by a value corresponding to the bias magnetic field 252 (represented by the symbol $H_{\perp\,bias}$) such that the saturation current $i_S$ varies in a monotonic fashion around the null out-of-plane component 452 ($H_\perp=0$). Provided a calibration curve relating the saturation current $i_S$ to known values of the out-of-plane component 452 has been established for the magnetic sensor cell 1, the direction and the magnitude of the out-of-plane component 452 can be determined by comparing the saturating current $i_S$ with a calibrated value of the calibration curve. Using the magnetic sensor cell 1 of FIG. 5, the direction of the out-of-plane component 452 can be determined when the out-of-plane component 452 has a magnitude that is lower than the magnitude of the bias magnetic field 252.

Since the perpendicular component 452 changes the sensitivity of the magnetic tunnel junction 2 to the in-plane component 451, the out-of-plane component 452 is preferably measured prior to the measurement of the in-plane component 451, so that the change of sensitivity due to the out-of-plane component is known. That allows sensing the in-plane component 451 using a calibration curve relating the change of sensitivity as a function of the out-of-plane component 452.

Using the configuration of FIG. 5, sensing the in-plane component 451 can further comprise passing the field current 41 for saturating the sense layer magnetization 210 with a first polarity; passing the field current 41 for saturating the sense layer magnetization 210 with a second polarity opposed to the first polarity; and determining the difference between the field current 41 having the first and second polarity.

In the case the sense layer 21 comprises non-magnetic layer 212 and ferromagnetic layer 211, the composition and thickness of the non-magnetic layer 212 and ferromagnetic layer 211 can be adjusted such as to vary the value of the saturating current $i_S$. The value of the saturating current $i_S$ can be further varied by adjusting the oxidation state of the insulating layer 213 or of the non-magnetic layer 212. The insulating layer 213 can be used as a tunnel barrier. For example, in FIG. 17 the insulating layer 213 can replace the tunnel barrier layer 22 of FIG. 2. In any case, the tunnel barrier layer 22, or insulating layer 213, should be in contact with the sense layer 21. Alternatively, the composition and thickness of the barrier tunnel 22 can be adjusted such as to vary the value of the saturating current $i_S$.

In another embodiment, the sense magnetization 210 is initially oriented in-plane and parallel or antiparallel to the reference magnetization 230. Sensing the out-of-plane component 452 can comprise passing the field current 41 in the field line 4 such as to align the sense magnetization 210 from its initial direction to a substantially aligned direction being oriented out-of-plane. Sensing the out-of-plane component 452 can further comprise measuring an intermediate resistance Rint of the magnetic tunnel junction 2 and determining the current 41 required to saturate the sense magnetization 210 in the aligned direction. The intermediate resistance Rint corresponds to the sense magnetization 210 being oriented out-of-plane, i.e., perpendicular to the storage magnetization 230. Here, the intermediate resistance Rint is equal to (Rmin+Rmax)/2, where Rmin and Rmax is the resistance of the magnetic tunnel junction 2 when the sense magnetization is oriented, respectively, parallel and antiparallel to the storage magnetization 230.

Figure 10:
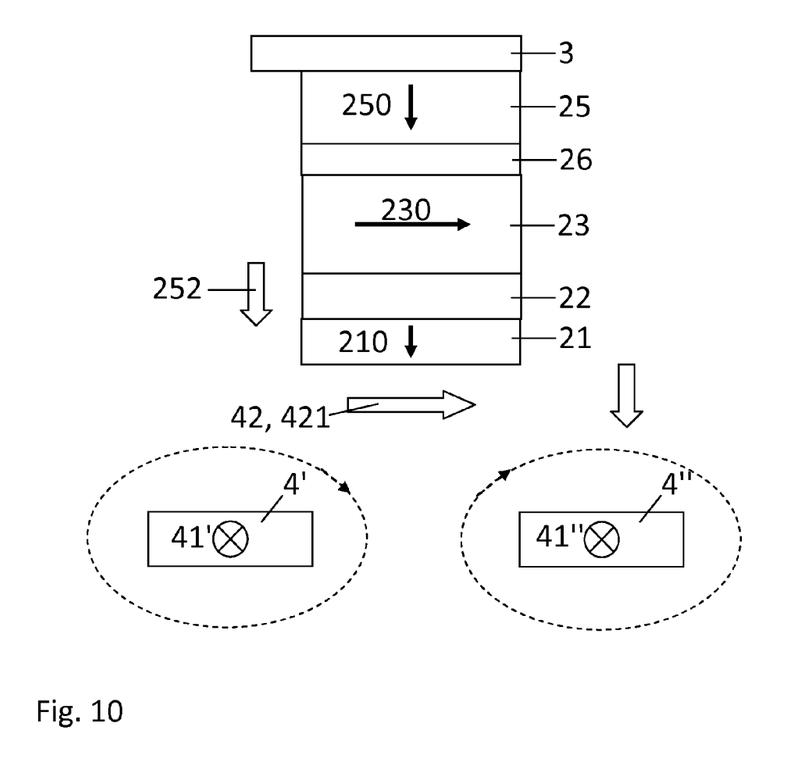
FIG. 10 shows the magnetic sensor cell wherein the field line comprises a first line portion and a second line portion, according to an embodiment.
Figure 12:
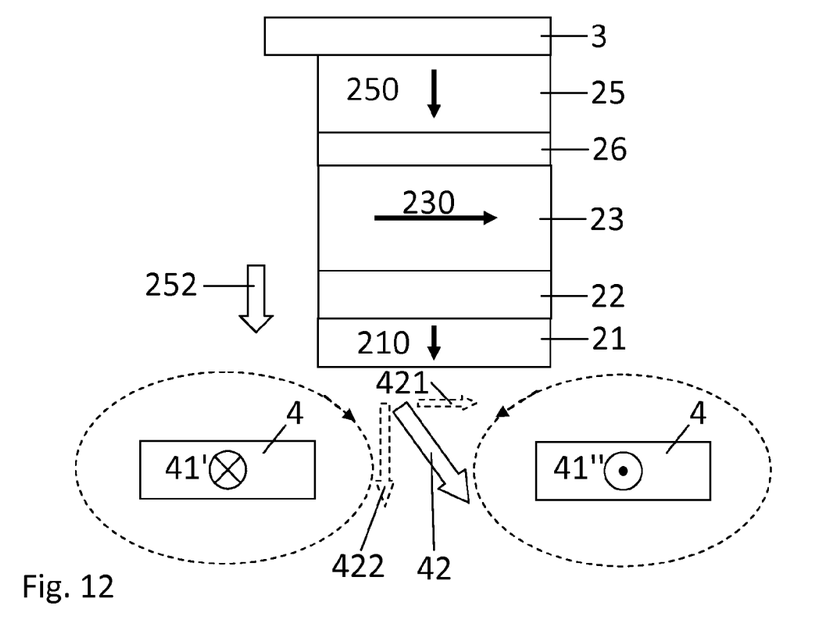
FIG. 12 shows the magnetic sensor cell of FIG. 10, according to yet another embodiment.

In an embodiment shown in FIGS. 10 to 12, the field line 4 comprises a first line portion 4' adapted for passing a first field current portion 41' and a second line portion 4" for passing a second field current portion 41". The first and second field current portion 41', 41" are arranged in a direction parallel to the plane of the sense layer 21. In this configuration, the sense magnetic field 42 is generated by the first and second field current portions 41', 41".

In the example of FIG. 10, the first field current portion 41' and the second field current portion 41" have the same polarity. The sense magnetic field 42 generated by the first and second field current portions 41', 41" having the same polarity comprises only the parallel component 421.

In the examples of FIGS. 11 and 12, the first field current portion 41' has a polarity being opposed to the one of the second field current portion 41". Passing the first field current portion 41' with a magnitude being equal to the one of the second field current portion 41" results in the sense magnetic field 42 having only the perpendicular component 422 (see FIG. 11). FIG. 12 shows the sense magnetic field 42 having the parallel component 421 and the perpendicular component 422 when the first field current portion 41' has a magnitude that differs from the one of the second field current portion 41". In the particular example of FIG. 12, the magnitude of the first field current portion 41' is larger than the one of the second field current portion 41" and the parallel component 421 is directed toward the right (the sense magnetic field 42 is oriented oblique towards the right).

An advantage of the external magnetic field 42 having a parallel and perpendicular component 421, 422 is that the in-plane component 451 can be measured with improved sensitivity, independently of the magnitude of the magnitude of the perpendicular component 452. The out-of-plane component 452 can be sensed using the method described above. In particular, the first and second field current portions 41' and 41" can be adjusted so that, in the absence of the bias layer 25, the perpendicular component 422 has an amplitude that is substantially equal to the perpendicular component 452 but is oriented in a direction opposite to the one of the perpendicular component 452 such as to cancel out the perpendicular component 452. In the presence of the bias layer 25, the perpendicular component 422 has an amplitude that is substantially equal to the sum of the bias field 252 and the perpendicular component 452 and is oriented in a direction opposite to the one of the sum of the bias field 252 and the perpendicular component 452 such as to cancel out the perpendicular component 452 and the bias field 252. The in-plane component 421 can thus be sensed by adjusting the sense currents 41 and 41' such that the in-plane component 421 alternatively aligns the sense magnetization 210 in a direction substantially parallel and antiparallel to the reference magnetization 230 using the self-reference read operation described above.

Figure 13:
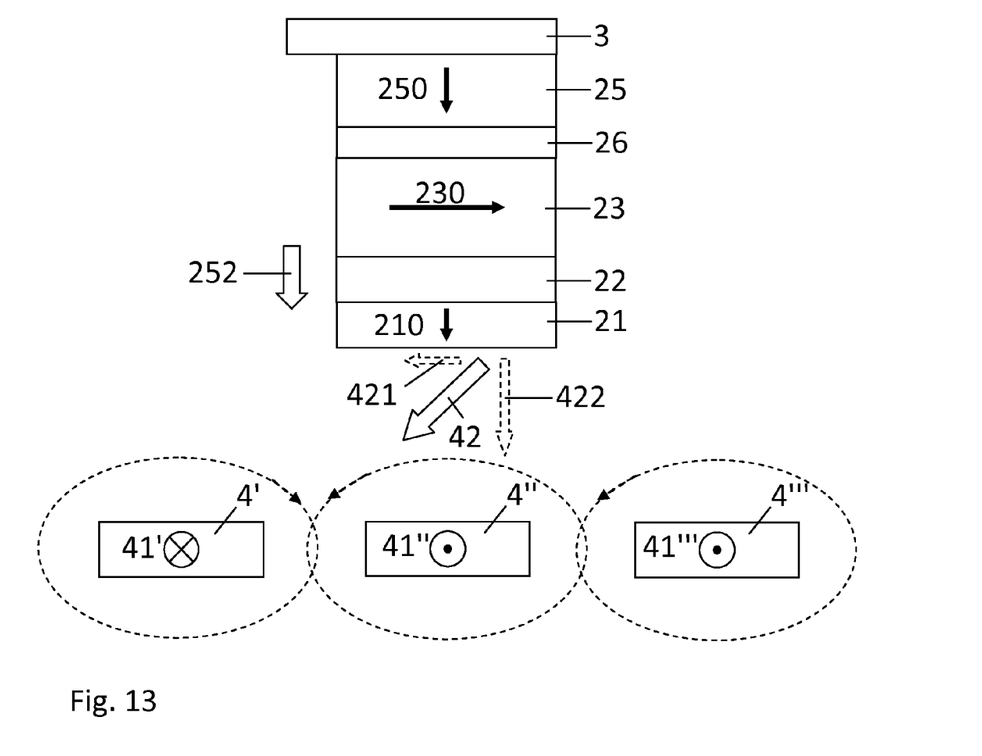
FIG. 13 shows the magnetic sensor cell of FIG. 10 further comprising a third line portion.

In an embodiment shown in FIG. 13, the field line 4 further comprises a third field line portion 4''' arranged for passing a third field current portion 41'''. In this configuration, the sense magnetic field 42 is generated by the first, second and third field current portions 41', 41", 41'". In the example of FIG. 13, the first field current portions 41' is passed with a polarity being opposed to the one of the second and third field current portions 41", 41'" such that the sense magnetic field 42 has a non-null parallel component 421 and perpendicular component 422.

Figure 14:
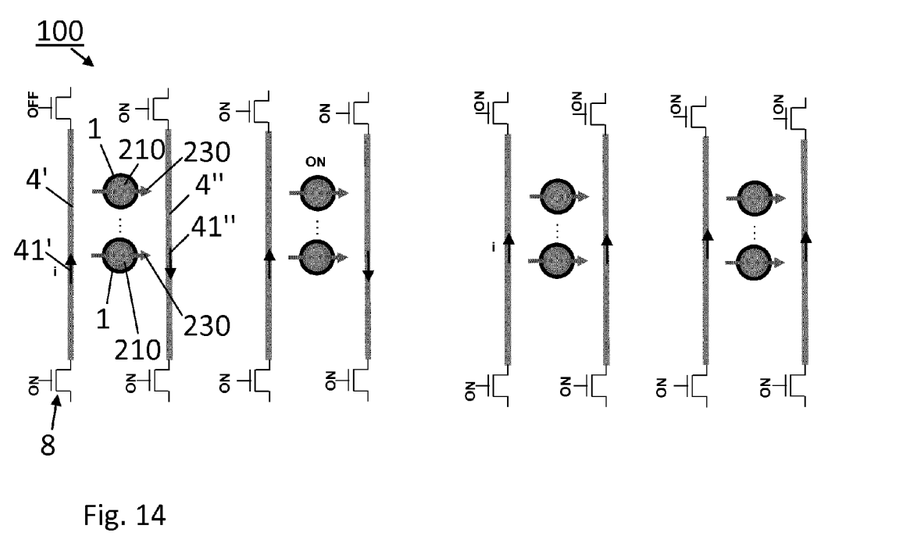
FIG. 14 represents a magnetic sensor device comprising a plurality of the magnetic sensor cell, according to an embodiment.

A magnetic sensor device 100 can comprise a plurality of the magnetic sensor cell 1 arranged in an array of rows and columns. In the embodiment illustrated in FIG. 14, the magnetic sensor device 100 comprises a plurality of the field line portions 4', 4" arranged parallel to the rows or columns such that a row or column of magnetic sensor cells 1 is addressed by two adjacent field line portions 4', 4". Each of said two adjacent field line portions 4', 4" are arranged such that the field current 41 can be passed independently in one of said two adjacent field line portions 4', 4" and in the other of said two adjacent field line portions 4', 4". In the example of FIG. 14, each field line portion 4', 4" can be addressed independently via commutation means, illustrated as transistors 8.

One of said two adjacent field line portions 4', 4" is arranged for passing a first field current portion 41' with a first polarity and the other of said two adjacent field line portions 4" is arranged for passing a second field current portion 41" with second polarity, opposed to the first polarity, such as to generate the sense magnetic field 42 directed perpendicular to the plane of the sense layer 21; or being the same as the first polarity such as to generate the sense magnetic field 42 directed parallel to the plane of the sense layer 21.

Figure 15:
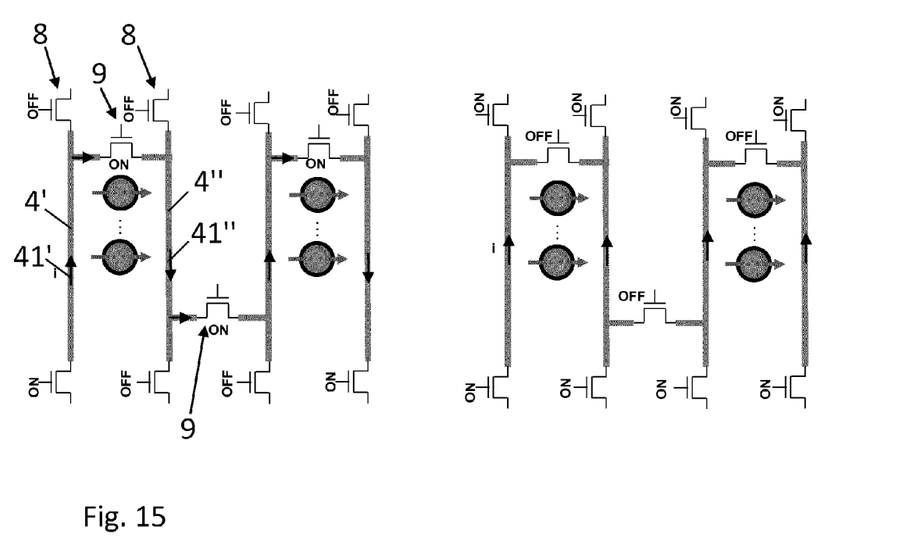
FIG. 15 represents the magnetic sensor device, according to another embodiment.

In the embodiment illustrated in FIG. 15, the two adjacent field line portions 4', 4" are electrically connected in series via a commutation means, here a conductive line branch in series with a transistor 9 such that the first and second field current portions 41', 41" can be passed respectively in the two adjacent field lines 4', 4" with the same polarity, or with opposed polarity.

Figure 16:
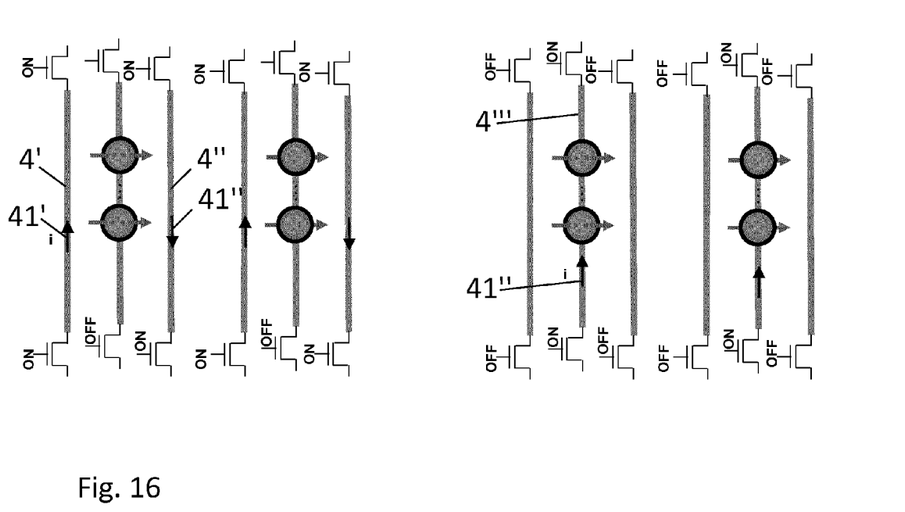
FIG. 16 represents the magnetic sensor device, according to yet another embodiment.

In yet another embodiment illustrated in FIG. 16, a third field line portion 4'" extends parallel to the first and second field line portions 4', 4". In this arrangement, the first and second field current portions 41', 41" can be passed respectively in the two adjacent field lines 4', 4" with opposed polarities such as to generate the sense magnetic field 42 directed perpendicular to the plane of the sense layer 21. A third field current portion 41'" can be passed in the third field line portions 4'" such as to generate the sense magnetic field 42 directed parallel to the plane of the sense layer 21.

In an embodiment, a first portion of the sensor device 100 array comprises a subset of the plurality of the sensor cell 1 arranged for sensing the out-of-plane component 452, and a second portion of the sensor device 100 array comprises another subset of the plurality of the sensor cell 1 arranged for sensing the in-plane component 451. For example, the sensor cells 1 in the second subset are turned at 90° compared to the sensor cells 1 comprised in the first subset. Here, the expression "turned at 90°" means that the sensor cell 1 is turned with an angle of about 90° about a longitudinal axis 11 (see FIG. 2). In the configuration of FIG. 2, the storage magnetization 230 and the direction of the sense magnetization 42 (the parallel component 421) of the sensor cells 1 in the second subset will be oriented at about 90° with respect to the storage magnetization 230 and sense magnetization 42 of the sensor cells 1 in the first subset. In the case where the in-plane component of the external magnetic field 45 comprise a component 451' oriented in the plane of the in-plane component 451 but perpendicular to it (see FIG. 2), the component 451' can be measured by the sensor cells 1 in the second subset and the component 451 can be measured by the sensor cells 1 in the first subset. The in-plane component 451, 451' can be measured by using the differential read operation described above.

REFERENCE NUMBERS AND SYMBOLS 1 magnetic sensor cell
11 longitudinal axis
100 magnetic sensor device
2 magnetic tunnel junction
21 sense layer
210 sense magnetization
211 ferromagnetic layer
212 non-magnetic layer
213 insulating layer
22 tunnel barrier layer
23 reference layer
230 reference magnetization
25 bias layer
250 bias magnetization
252 bias magnetic field
26 antiferromagnetic layer
3 current line
32 sense current
4 field line
4' first line portion
4" second line portion
4'" third line portion
41 field current
41' first field current portion
41" second field current portion
41'" third field current portion
42 sense magnetic field
421 parallel component
422 perpendicular component
45 external magnetic field
451 in-plane component of 45
452 out-of-plane component of 45
8, 9 transistor
$H_\perp$ out-of-plane component of 45
$H_{\perp\,bias}$ bias magnetic field
$i_S$ saturating current
$M_S$ saturation magnetization of the sense layer
R resistance of the magnetic tunnel junction
R1 first resistance
R2 second resistance

What is claimed is:
1. Magnetic sensor cell comprising:
a heating current line;
a magnetic tunnel junction comprising a reference layer having a reference magnetization configured such that the reference magnetization is orientable in a predetermined direction substantially parallel to the plane of the reference layer when the magnetic tunnel junction is heated to a temperature threshold by the heating current line, a sense layer having a sense magnetization, and a tunnel barrier layer between the sense and reference layers; and
a magnetic device configured for providing a sense magnetic field configured for aligning the sense magnetization;
the sense magnetization being orientable between a direction parallel to the plane of the sense layer and a direction perpendicular to the plane of the sense layer when the sense magnetic field is provided.

2. The magnetic sensor cell according to claim 1, wherein the sense magnetization is orientable with a magnitude of an external magnetic field being below 150 Oe.

3. The magnetic sensor cell according to claim 1, wherein the sense magnetization has an initial orientation, in the absence of an external magnetic field, substantially perpendicular to the plane of the sense layer and an aligned orientation, in the presence of the sense magnetic field, being at least partly oriented parallel to the plane of the sense layer.

4. The magnetic sensor cell according to claim 1, wherein the sense magnetization has an initial orientation, in the absence of an external magnetic field, substantially parallel to the plane of the sense layer and an aligned orientation, in the presence of the sense magnetic field, being at least partly oriented perpendicular to the plane of the sense layer.

5. The magnetic sensor cell according to claim 1, wherein the sense layer comprises any one of or a combination of Fe, Co, Ni, Tb, Pt, Pd, Al, Dy, Ga, Mn, Ho, Nd or Sm, FePt, FePd, CoPt, CoPd, GdFeCo, TbFeCo, GaMn, GeMn or AlMn.

6. The magnetic sensor cell according to claim 5, wherein the sense layer has a thickness comprised between 0.2 nm and 50 nm.

7. The magnetic sensor cell according to claim 1, wherein the sense layer further comprises non-magnetic layer.

8. The magnetic sensor cell according to claim 7, wherein the non-magnetic layer comprises any one of Pt, Pd, Ta, Hf, Nb, Cr, V, Cu, Au, Ti, Ag, Ru, W or an alloy comprising any one or a combination of these elements, or an oxide or an oxi-nitride.

9. The magnetic sensor cell according to claim 1, further comprising a bias layer having a bias magnetization oriented perpendicular to the plane of the bias layer and generating a bias magnetic field on the sense magnetization oriented perpendicular to the plane of the sense layer.

10. The magnetic sensor cell according to claim 1, wherein the magnetic device comprises a field line arranged parallel to the plane of the sense layer and for passing a field current such that the sense magnetic field is oriented parallel to the plane of the sense layer.

11. The magnetic sensor cell according to claim 1, wherein the field line comprises a first line portion for passing a first field current and a second line portion for passing a second field current, the first and second line portions being arranged parallel to the plane of the sense layer, the sense magnetic field being generated by a combination of the first and second field currents, respectively.

12. The magnetic sensor cell according to claim 11, wherein the field line further comprises a third field line for passing a third field current and arranged parallel to the plane of the sense layer, the sense magnetic field being generated by the first, second and third field currents, respectively.

13. A magnetic sensor device comprising:
   a plurality of the magnetic sensor cell arranged in rows and columns, each magnetic sensor cell comprising a heating current line;
   a magnetic tunnel junction including a reference layer having a reference magnetization configured such that the reference magnetization is orientable in a predetermined direction substantially parallel to the plane of the reference layer when the magnetic tunnel junction is heated to a temperature threshold by the heating current line, a sense layer having a sense magnetization, and a tunnel barrier layer between the sense and reference layers; and
   a magnetic device configured for providing a sense magnetic field configured for aligning the sense magnetization;
   the sense magnetization being orientable between a direction parallel to the plane of the sense layer and a direction perpendicular to the plane of the sense layer when the sense magnetic field is provided.

14. The magnetic sensor device according to claim 13, wherein the field line comprises a first line portion for passing a first field current and a second line portion for passing a second field current, the first and second line portions being arranged parallel to the plane of the sense layer, the sense magnetic field being generated by a combination of the first and second field currents, respectively; and
   wherein the first line portion and a second line portion are arranged for passing, respectively, the first and second field current independently from each other.

15. The magnetic sensor device according to claim 13, wherein the field line comprises a first line portion for passing a first field current and a second line portion for passing a second field current, the first and second line portions being arranged parallel to the plane of the sense layer, the sense magnetic field being generated by a combination of the first and second field currents, respectively; and
   wherein the first and second line portions are electrically connected in series via a commutation means such that the first and second field current can be passed in the first and second line portions with the same polarity or with opposed polarity.

16. The magnetic sensor device according to claim 13, wherein the field line comprises a first line portion for passing a first field current and a second line portion for passing a second field current, the first and second line portions being arranged parallel to the plane of the sense layer, the sense magnetic field being generated by a combination of the first and second field currents, respectively;
   wherein the field line further comprises a third field line for passing a third field current and arranged parallel to the plane of the sense layer, the sense magnetic field being generated by the first, second and third field currents, respectively;
   wherein the first and second field currents can be passed in the first and second line portions with opposed polarity such as to generate the sense magnetic field directed perpendicular to the plane of the sense layer; and
   wherein the third field current can be passed in the third line portion such as to generate the sense magnetic field directed parallel to the plane of the sense layer.

* * * * *

UNITED STATES PATENT AND TRADEMARK OFFICE
CERTIFICATE OF CORRECTION

PATENT NO.        : 9,989,599 B2                           Page 1 of 1
APPLICATION NO.   : 15/028114
DATED             : June 5, 2018
INVENTOR(S)       : Sebastien Bandiera It is certified that error appears in the above-identified patent and that said Letters Patent is hereby corrected as shown below:

In the Specification

Under the REFERENCE NUMBERS AND SYMBOLS section:
Column 10, Line 29: please delete "41''''" and replace it with -- 4''' --.

Signed and Sealed this
Twenty-fifth Day of September, 2018

Andrei Iancu
*Director of the United States Patent and Trademark Office*